(12) United States Patent
Yu et al.

(10) Patent No.: US 10,879,328 B2
(45) Date of Patent: Dec. 29, 2020

(54) THIN FILM TRANSISTOR (TFT) SUBSTRATE, MANUFACTURING METHOD THEREOF, AND ORGANIC LIGHT-EMITTING DIODE (OLED) SUBSTRATE

(71) Applicant: Wuhan China Star Optoelectronics Semiconductor Display Technology Co., Ltd., Wuhan (CN)

(72) Inventors: Lei Yu, Wuhan (CN); Songshan Li, Wuhan (CN)

(73) Assignees: WUHAN CHINA STAR OPTOELECTRONICS, Hubei (CN); SEMICONDUCTOR DISPLAY TECHNOLOGY CO.. LTD., Hubei (CN)

( * ) Notice: Subject to any disclaimer, the term of this patent is extended or adjusted under 35 U.S.C. 154(b) by 0 days.

(21) Appl. No.: 16/556,141

(22) Filed: Aug. 29, 2019

(65) Prior Publication Data

US 2019/0386082 A1    Dec. 19, 2019

Related U.S. Application Data

(62) Division of application No. 15/771,047, filed on Apr. 25, 2018, now Pat. No. 10,446,630.

(30) Foreign Application Priority Data

Feb. 11, 2018 (CN) .......................... 2018 1 0143002

(51) Int. Cl.
*H01L 27/32* (2006.01)
*H01L 27/12* (2006.01)
*H01L 51/00* (2006.01)

(52) U.S. Cl.
CPC ...... *H01L 27/3258* (2013.01); *H01L 27/1274* (2013.01); *H01L 27/3248* (2013.01);
(Continued)

(58) Field of Classification Search
CPC ............. H01L 27/3258; H01L 27/1274; H01L 27/3248; H01L 27/124; H01L 27/1248;
(Continued)

(56) References Cited

U.S. PATENT DOCUMENTS 5,962,916 A * 10/1999 Nakanishi et al. .......................... H01L 21/76804 257/57
2003/0057450 A1* 3/2003 Arao .................. H01L 29/76833 257/200

(Continued)

*Primary Examiner* — Thinh T Nguyen
(74) *Attorney, Agent, or Firm* — Leong C. Lei (57) ABSTRACT

The present disclosure relates to a thin film transistor (TFT) substrate, a manufacturing method thereof, and an organic light-emitting (OLED) substrate. The interlayer dielectric layer manufactured by the manufacturing method may be configured in the structure of two silicon oxide layers sandwiching one silicon nitride layer. As such, the bonding force between the interlayer dielectric layer and the gate, and the bonding force between the interlayer dielectric layer, and the source and the drain may be improved. The source and the drain may be prevented from falling off from the interlayer dielectric layer during the annealing process. Production yield of the TFT substrate may be improved. The OLED substrate adopting the manufactured of the OLED substrate of the present disclosure may have a better production yield and quality.

5 Claims, 8 Drawing Sheets

(52) U.S. Cl.
CPC ........ *H01L 27/124* (2013.01); *H01L 27/1248* (2013.01); *H01L 51/0051* (2013.01); *H01L 51/0072* (2013.01); *H01L 2227/323* (2013.01)

(58) Field of Classification Search
CPC ............. H01L 51/0051; H01L 51/0072; H01L 51/0046
USPC ............. 438/48, 82, 89, 128; 257/40, 66, 72
See application file for complete search history.

(56) References Cited

U.S. PATENT DOCUMENTS

2008/0118775 A1* 5/2008 Kim et al. .......... H01L 51/0046
428/690
2010/0163854 A1* 7/2010 Kho et al. ............. H01L 51/504
257/40

* cited by examiner

THIN FILM TRANSISTOR (TFT) SUBSTRATE, MANUFACTURING METHOD THEREOF, AND ORGANIC LIGHT-EMITTING DIODE (OLED) SUBSTRATE

CROSS REFERENCE TO RELATED APPLICATIONS

This is a divisional application of co-pending U.S. patent application Ser. No. 15/771,047, filed on Apr. 25, 2018, which is a national stage of PCT Application No. PCT/CN2018/079359, filed on Mar. 16, 2018, claiming foreign priority of Chinese Patent Application No. 201810143002.4, filed on Feb. 11, 2018.

TECHNICAL FIELD

The present disclosure relates to display field, and more particularly to a thin film transistor (TFT) substrate, a manufacturing method thereof, and an organic light-emitting diode (OLED) substrate.

DESCRIPTION OF RELATED ART

Flat display devices have been widely adopted due to the attributes, such as thin, low power consuming, and no-radiation. The conventional flat display devices mainly include liquid crystal displays (LCDs) and organic light-emitting displays (OLEDs).

The OLED devices have become the most promising display devices due to the attributes, such as self-luminous, all solid state, and high contrast. The greatest feature of the OLED devices is to achieve flexible display devices. Adopting a flexible substrate to manufacture lightweight, flexible, and portable flexible display devices is an important trend for the OLED devices.

The OLEDs may be divided into passive matrix OLEDs (PMOLEDs) and active matrix OLEDs (AMOLEDs) according to the driving mode. That is, the OLED may be divided into the direct addressing type and the thin film transistor (TFT) matrix addressing type. The AMOLED is generally used as a high-definition large-sized display device due to the AMOLED has a plurality of pixels arranged in an array, which is of an active display type, and the AMOLED has high luminous performance.

Figure 1:
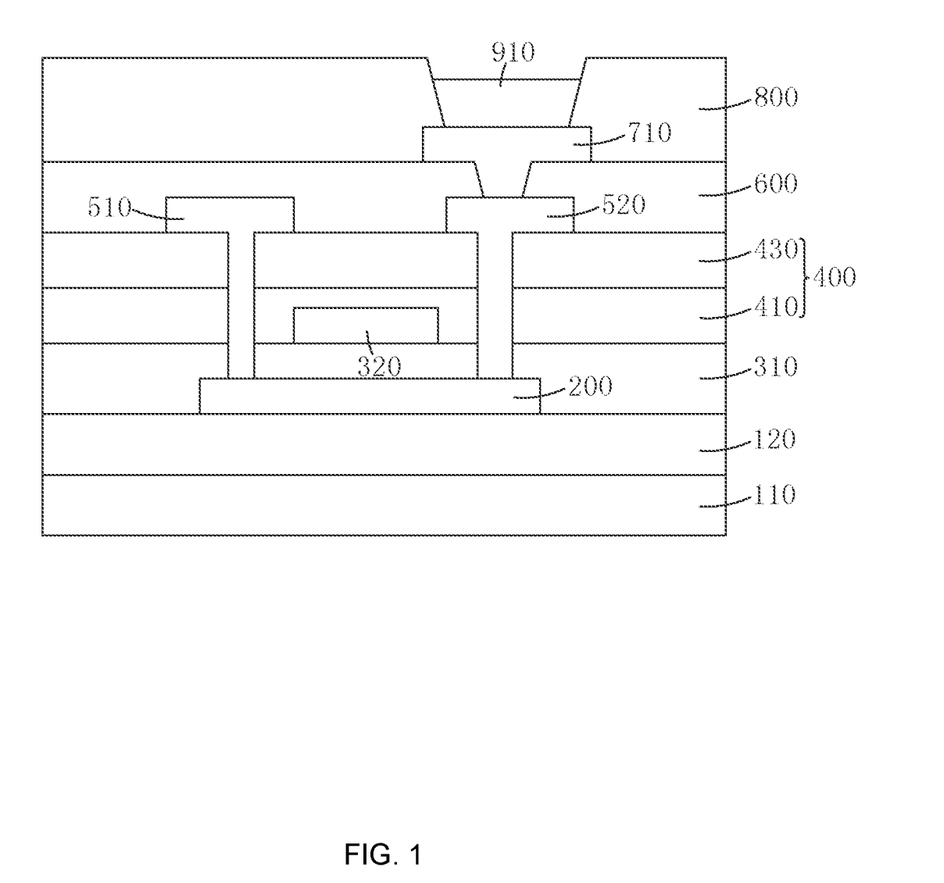
FIG. 1 is a schematic view illustrating a conventional AMOLED substrate.

FIG. 1 is a schematic view illustrating a conventional AMOLED substrate. As shown in FIG. 1, the AMOLED substrate may include a base substrate 110, a buffer layer 120 configured on the base substrate 110, an active layer 200 configured on the buffer layer 120, a gate insulation layer 310 configured on the active layer 200 and the buffer layer 120, a gate 320 configured on the gate insulation layer 310, an interlayer dielectric layer 400 configured on the gate 320 and the gate insulation layer 310, a source 510 and a drain 520 configured on the interlayer dielectric layer 400, a flat layer 600 configured on the source 510, the drain 520, and the interlayer dielectric layer 400, an anode 710 and a pixel definition layer 800 configured on the flat layer 600, and an OLED light-emitting layer 910 configured on the anode 710.

The interlayer dielectric layer 400 may include a silicon oxide (SiOx) layer 410 configured on the gate 320 and the gate insulation layer 310, and a silicon nitride (SiNx) layer 430 configured on the silicon oxide layer 410. The bonding force between the silicon oxide layer 410 and the gate 320 is strong. The silicon nitride layer 430 is configured to perform a hydrogen-adding process on the active layer 200.

The source 510 and the drain 520 may include an aluminum (Al) thin film and at least one titanium (Ti) thin film configured on two ends of the aluminum film. During the manufacturing process of the AMOLED substrate, after the source 510 and the drain 520 are obtained, an annealing process may be performed on the source 510 and the drain 520 to reduce a contact resistance between the source 510 and the drain 520, and the active layer 200, and to improve electrical connection. The bonding force between the source 510 and the titanium thin film of the drain 520 and the silicon nitride layer 430 of the interlayer dielectric layer 400 is weak. During the annealing process, the bonding force between the source 510 and the drain 520, and the interlayer dielectric layer 400 may further be reduced due to the high temperature manufacturing process. As such, the source 510 and the drain 520 may fall from the interlayer dielectric layer 400, which may reduce the production yield of the AMOLED.

SUMMARY

In one aspect, the present disclosure relates to a manufacturing method of a thin film transistor (TFT) including:

step S1, providing a base substrate, depositing a butler layer on the base substrate, and forming an active layer on the buffer layer; depositing a gate insulation layer on the active layer and the buffer layer, and forming a gate on the gate insulation layer;

step S2, depositing an interlayer dielectric layer on the gate and the gate insulation layer, wherein the interlayer dielectric layer includes a first silicon oxide layer, a first silicon nitride layer, and a second silicon oxide layer being stacked on the gate and the gate insulation layer in sequence from bottom to up;

step S3, conducting a patterned process on the interlayer dielectric layer and the gate insulation layer, and forming a source-contacting hole and a drain-contacting hole on the interlayer dielectric layer and the gate insulation layer, wherein the source-contacting hole and the drain-contacting hole respectively correspond to two ends of the active layer; forming a source and a drain on the interlayer dielectric layer to obtain a TFT substrate, wherein the source and the drain contact with the two ends of the active layer respectively via the source-contacting hole and the drain-contacting hole.

The step S2 further includes: conducting a rapid annealing process on the interlayer dielectric layer.

An annealing temperature of the rapid annealing process is in a range from 480 degrees to 510 degrees, and a heat-preservation time period is in a range from 10 minutes to 20 minutes.

The first silicon oxide layer, the first silicon nitride layer, and the second silicon oxide layer are formed by a chemical vapor deposition (CVD) process.

The step S3 further includes: conducting an annealing process on the source and the drain.

Both of the source and the drain include a source-drain metal layer, and the source-drain metal layer includes an aluminum thin film and at least one titanium thin film configured on two ends of the aluminum thin film.

The present disclosure further relates to an TFT substrate, including: a base substrate, a buffer layer configured on the base substrate, an active layer configured on the buffer layer, a gate insulation layer configured on the active layer and the buffer layer, a gate configured on the gate insulation layer, an interlayer dielectric layer configured on the gate and the gate insulation layer, and a source and a drain configured on the interlayer dielectric layer; wherein a source-contacting hole and a drain-contacting hole are configured on the interlayer dielectric layer and the gate insulation layer, the source-contacting hole and the drain-contacting hole respectively correspond to two ends of the active layer, and the source and the drain respectively contact with the two ends of the active layer via the source-contacting hole and the drain-contacting hole; the interlayer dielectric layer includes a first silicon oxide layer, a first silicon nitride layer, and a second silicon oxide layer configured on the gate and the gate insulation layer in sequence from bottom to up.

Both of the source and the drain include a source-drain metal layer, and the source-drain metal layer includes an aluminum thin film and at least one titanium thin film configured on two ends of the aluminum thin film.

The present disclosure further relates to an organic light-emitting diode (OLED) substrate, including: the TFT substrate as described in above, a flat layer configured on the source, the drain, and the interlayer dielectric layer of the TFT substrate, an anode and a pixel definition layer configured on the flat layer, and an OLED light-emitting layer configured on the anode; wherein a first through hole is configured on the flat layer, the first through hole corresponds to a top of the drain, and the anode contacts with the drain via the first through hole; and a second through hole is configured on the pixel definition layer, wherein the second through hole corresponds to a top of the anode, and the OLED light-emitting layer is arranged within the second through hole.

In view of the above, the present disclosure relates to the TFT substrate, the manufacturing method thereof, and the OLED substrate. The interlayer dielectric layer manufactured by the manufacturing method of the present disclosure may be configured in a structure of two silicon oxide layers sandwiching one silicon nitride layer. As such, the bonding force between the interlayer dielectric layer and the gate, and the bonding force between the interlayer dielectric layer and the source and the drain may be improved. The source and the drain may be prevented from falling off from the interlayer dielectric layer during the annealing process. Production yield of the TFT substrate may be improved. As such, the TFT substrate manufactured by the manufacturing method of the present disclosure may have a better production yield and quality, and the OLED substrate manufactured by the manufacturing method of the present disclosure may also have a better production yield and quality.

DETAILED DESCRIPTION

Following embodiments of the invention will now be described in detail hereinafter with reference to the accompanying drawings.

Figure 2:
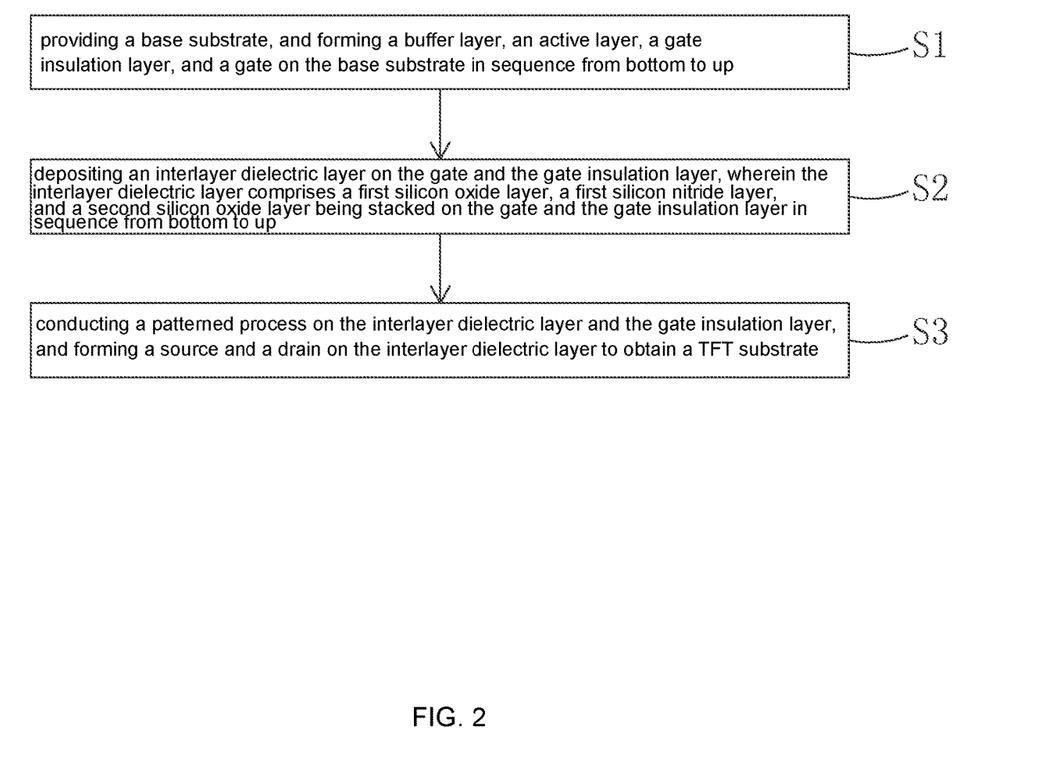
FIG. 2 is a flowchart illustrating a manufacturing method of a thin film transistor (TFT) substrate in accordance with one embodiment of the present disclosure.

Referring to FIG. 2, the present disclosure relates to a manufacturing method of a thin film transistor (TFT) substrate, including the following steps.

Figure 3:
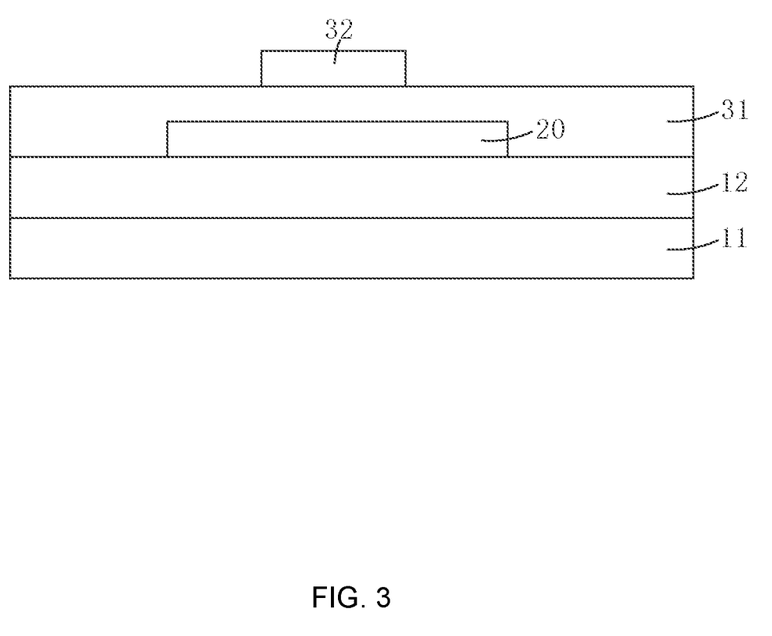
FIG. 3 is a schematic view illustrating step S1 of the manufacturing method of the TFT substrate in accordance with one embodiment of the present disclosure.

In step S1, as shown in FIG. 3, providing a base substrate 11, depositing a buffer layer 12 on the base substrate 11, and forming an active layer 20 on the buffer layer 12.

Depositing a gate insulation layer 31 on the active layer 20 and the buffer layer 12, and forming a gate 32 on the gate insulation layer 31.

In one example, the base substrate 11 is a glass substrate.

The buffer layer 12 of the step S1 is deposited by a chemical vapor deposition (CVD) process.

The buffer layer 12 includes a silicon nitride (SiNx) layer configured on the base substrate 11 and a silicon oxide (SiOx) layer configured on the silicon nitride layer.

The manufacturing method of forming the active layer 20 on the buffer layer 12 includes: forming an amorphous silicon layer on the buffer layer 12 by the CVD process, performing a dehydrogenation process on the amorphous silicon layer, conducting an excimer laser anneal (ELA) process on the amorphous silicon layer to crystalize the amorphous silicon layer into a polysilicon layer, and conducting a patterned process on the polysilicon layer to obtain the active layer 20.

Specifically, the dehydrogenation process is conducted on the amorphous layer by an annealing process.

In one example, the gate insulation layer 31 is the silicon oxide layer.

The manufacturing method of forming the gate 32 on the gate insulation layer 31 in step S1 includes: depositing a gate metal layer on the gate insulation layer 31 by a physical vapor deposition (PVD) process, and conducting the patterned process on the gate metal layer to obtain the gate 32.

In one example, the gate 32 is made of molybdenum (Mo).

Figure 4:
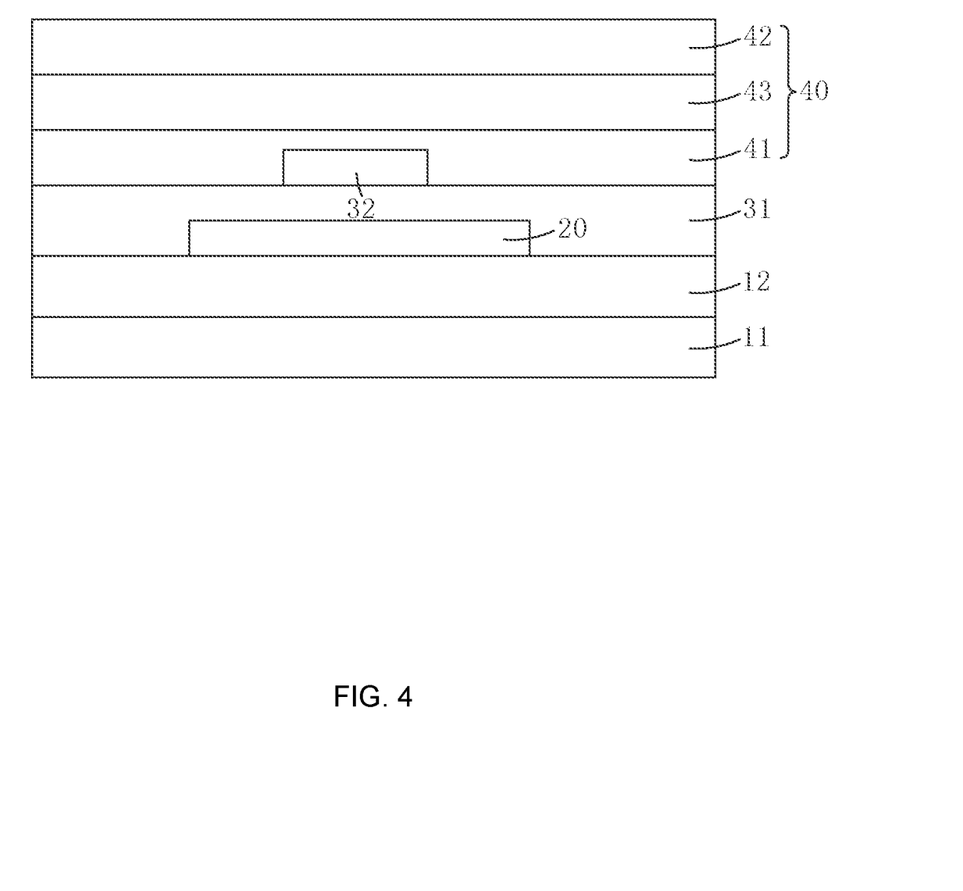
FIG. 4 is a schematic view illustrating step S2 of the manufacturing method of the TFT substrate in accordance with one embodiment of the present disclosure.

As shown in FIG. 4, in step S2, depositing an interlayer dielectric layer 40 on the gate 32 and the gate insulation layer 31.

The interlayer dielectric layer 40 includes a first silicon oxide layer 41, a first silicon nitride layer 43, and a second silicon oxide layer 42 being stacked on the gate 32 and the gate insulation layer 31 in sequence from bottom to up.

In one example, the first silicon oxide layer 41, the first silicon nitride layer 43 and the second silicon oxide layer 42 are deposited by the CVD process. CVD reaction gas of the first silicon nitride layer 43 includes ammonia and silane. Ammonia and silane both include hydrogen. As such, the first silicon nitride layer 43 may include hydrogen.

Bonding force between the first silicon oxide layer 41 and the gate 32 is strong, and the bonding between the interlayer dielectric layer 40 and the gate 32 is good. The first silicon nitride layer 43 may perform a hydrogen-adding process on the active layer 20 when the annealing process is conducted on the interlayer dielectric layer 40. As such, bonding force between the second silicon oxide layer 42, and a source 51 and a drain 52 may be improved, and bonding force between the interlayer dielectric layer 40, and the source 51 and the drain 52 may be improved. The source 51 and the drain 52 may be prevented from falling off from the interlayer dielectric layer 40 during the annealing process of the source 51 and the drain 52.

Specifically, the step S2 further includes: conducting a rapid annealing process (RTA) on the interlayer dielectric layer 40.

As such, the hydrogen in the first silicon nitride layer 43 of the interlayer dielectric layer 40 may diffuse to the active layer 20 to perform the hydrogen-adding process on the polysilicon layer to reduce defects of the polysilicon layer and to stabilize operations of the TFT.

In one example, an annealing temperature of the RTA process is in a range from 480 degrees to 510 degrees, for example, 490 degrees. A heat-preservation time period is in a range from 10 minutes to 20 minutes.

In one example, the first silicon oxide layer 41, the first silicon nitride layer 43, and the second silicon oxide layer 42 are formed by the CVD process.

Figure 5:
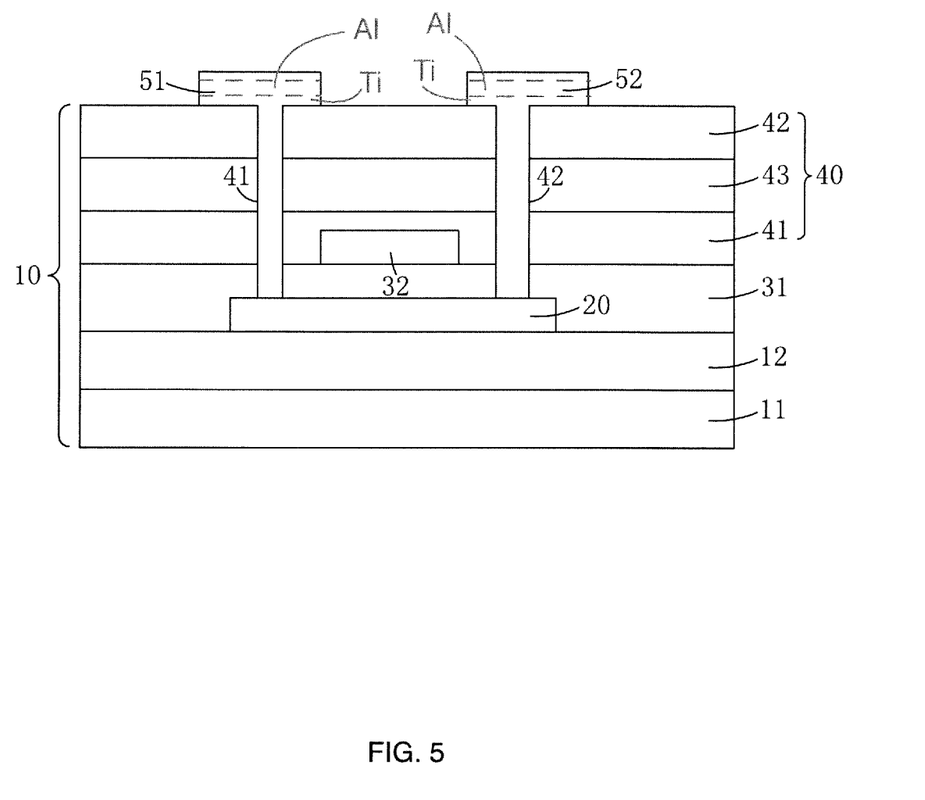
FIG. 5 is a schematic view illustrating step S3 of the manufacturing method of the TFT substrate and a TFT substrate in accordance with one embodiment of the present disclosure.

As shown in FIG. 5, in step S3, conducting the patterned process on the interlayer dielectric layer 40 and the gate insulation layer 31, and forming a source-contacting hole 41 and a drain-contacting hole 42 on the interlayer dielectric layer 40 and the gate insulation layer 31, wherein the source-contacting hole 41 and the drain-contacting hole 42 respectively correspond to two ends of the active layer 20.

Forming the source 51 and the drain 52 on the interlayer dielectric layer 40 to obtain a TFT substrate 10, wherein the source 51 and the drain 52 contact with the two ends of the active layer 20 respectively via the source-contacting hole 51 and the drain-contacting hole 52.

Specifically, the step S3 further includes: conducting the annealing process on the source 51 and the drain 52 to reduce a contact resistance between the source 51 and the drain 52, and the active layer 20, and to improve electrical connection.

In one example, an annealing temperature of the annealing process is in a range from 300 degrees to 400 degrees, for example, 350 degrees.

Both of the source 51 and the drain 52 include a source-drain metal layer, and the source-drain metal layer includes an aluminum (Al) thin film and at least one titanium (Ti) thin film configured on two ends of the aluminum thin film.

Specifically, the manufacturing method of forming the source 51 and the drain 52 on the interlayer dielectric layer 40 includes depositing a source metal layer on the interlayer dielectric layer 40 by the PVD process, and conducting the patterned process on the source metal layer to obtain the source 51 and the drain 52.

The interlayer dielectric layer 40 manufactured by the manufacturing method of the TFT substrate may be configured in a structure of two silicon oxide layers sandwiching one silicon nitride layer. As such, the bonding force between the interlayer dielectric layer 40 and the gate 32, and the bonding force between the interlayer dielectric layer 40, and the source 51 and the drain 52 may be improved. The source 51 and the drain 52 may be prevented from falling off from the interlayer dielectric layer 40 during the annealing process. Production yield of the TFT substrate 10 may be improved.

Referring to FIG. 5, the present disclosure relates to the TFT substrate 10, including: the base substrate 11, the buffer layer 12 configured on the base substrate 11, the active layer 20 configured on the buffer layer 12, the gate insulation layer 31 configured on the active layer 20 and the buffer layer 12, the gate 32 configured on the gate insulation layer 31, the interlayer dielectric layer 40 configured on the gate 32 and the gate insulation layer 31, and the source 51 and the drain 52 configured on the interlayer dielectric layer 40.

The source-contacting hole 41 and a drain-contacting hole 42 are configured on the interlayer dielectric layer 40 and the gate insulation layer 31. The source-contacting hole 41 and the drain-contacting hole 42 respectively correspond to two ends of the active layer 20. The source 51 and the drain 52 respectively contact with the two ends of the active layer 20 via the source-contacting hole 41 and the drain-contacting, hole 42.

The interlayer dielectric layer 40 includes the first silicon oxide layer 41, the first silicon nitride layer 43, and the second silicon oxide layer 42 configured on the gate 32 and the gate insulation layer 31 in sequence from bottom to up.

The buffer layer 12 includes the silicon nitride layer configured on the base substrate 11 and the silicon oxide layer configured on the silicon nitride layer.

In one example, the gate insulation layer 31 is the silicon oxide layer.

In one example, the gate 32 is made of molybdenum.

Both of the source 51 and the drain 52 include the source-drain metal layer, and the source-drain metal layer includes the aluminum thin film and at least one titanium thin film configured on two ends of the aluminum thin film.

In one example, the active layer 20 is made of polysilicon.

The interlayer dielectric layer 40 manufactured by the manufacturing method of the TFT substrate may be configured in the structure of two silicon oxide layers sandwiching one silicon nitride layer. As such, the bonding force between the interlayer dielectric layer 40 and the gate 32, and the bonding force between the interlayer dielectric layer 40, and the source 51 and the drain 52 may be improved. The source 51 and the drain 52 may be prevented from falling off from the interlayer dielectric layer 40 during the annealing process. Production yield of the TFT substrate 10 may be improved.

Figure 6:
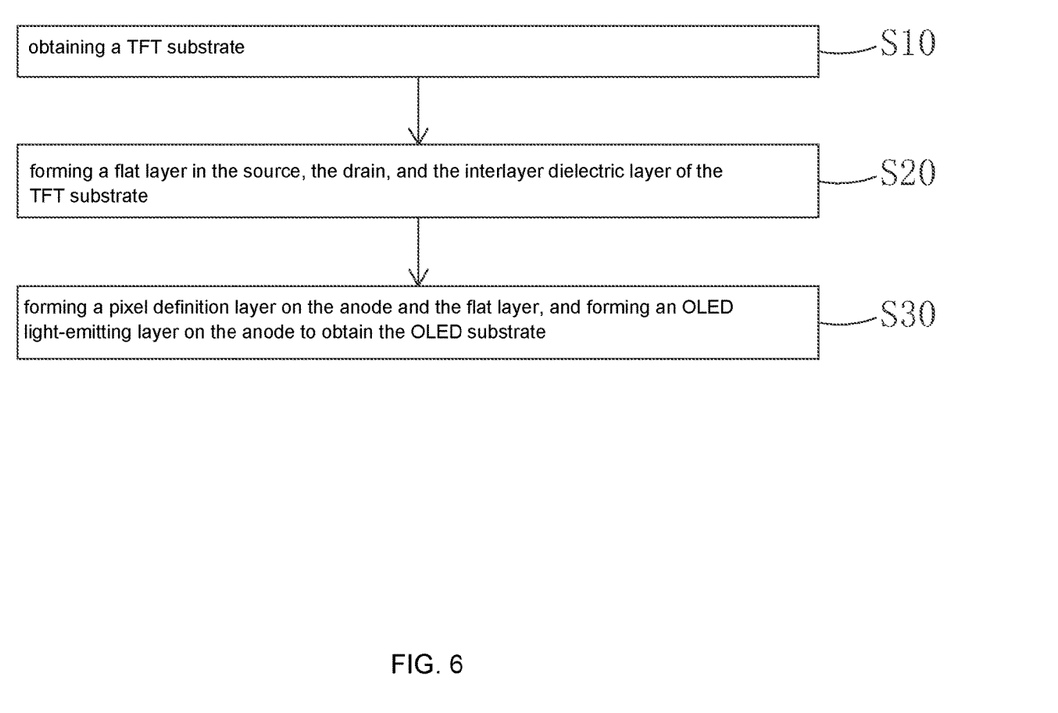
FIG. 6 is a flowchart illustrating a manufacturing method of an organic light-emitting diode (OLED) substrate in accordance with one embodiment of the present disclosure.

Referring to FIG. 6, the present disclosure relates to a manufacturing process of an organic light-emitting diode (OLED) substrate, including the following steps.

In step S10, adopting the manufacturing method of the TFT substrate to obtain the TFT substrate 10.

Figure 7:
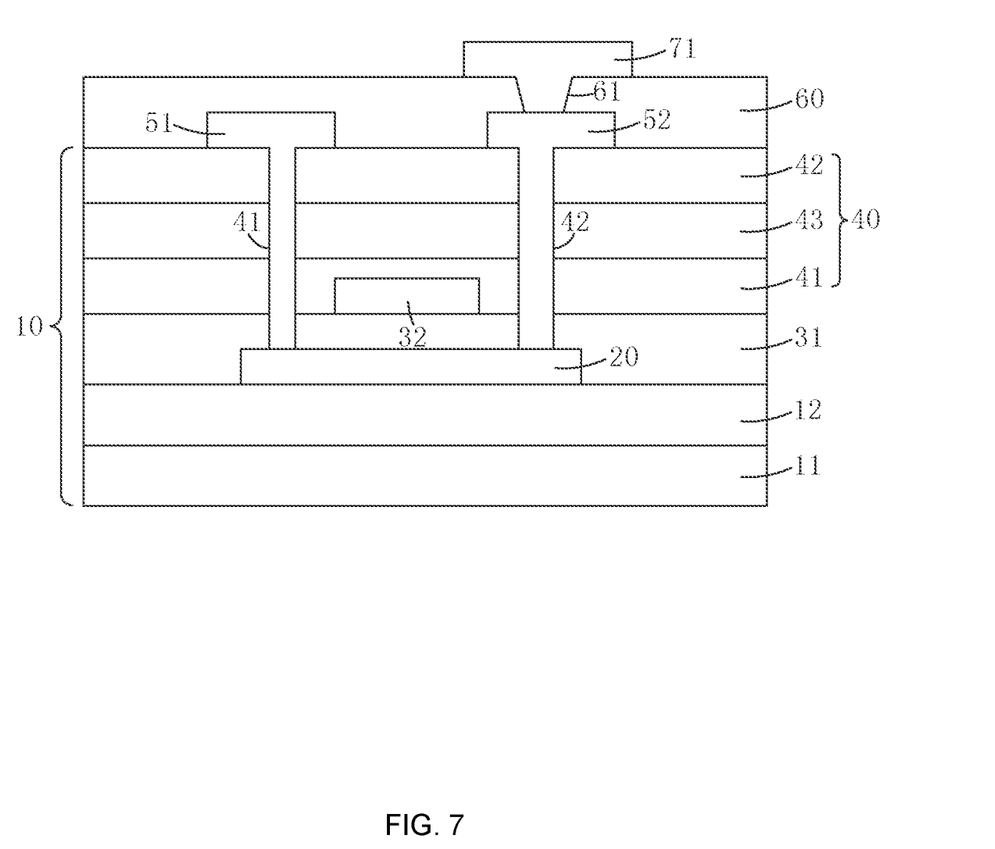
FIG. 7 is a schematic view illustrating step S20 of the manufacturing method of the OLED substrate in accordance with one embodiment of the present disclosure.

In step S20, as shown in FIG. 7, forming a flat layer 60 on the source 51, the drain 52, and the interlayer dielectric layer 40 of the TFT substrate 10, conducting the patterned process on the flat layer 60, and forming a first through hole 61 on the flat layer 60, wherein the first through hole 61 corresponds to a top of the drain 52.

Forming an anode 71 on the flat layer 60, wherein the anode 71 contacts with the drain 52 via the first through hole 61.

Specifically, the anode 71 may include a silver (Ag) thin film and at least one indium tin oxide (ITO) thin film configured on two ends of the silver thin film.

Figure 8:
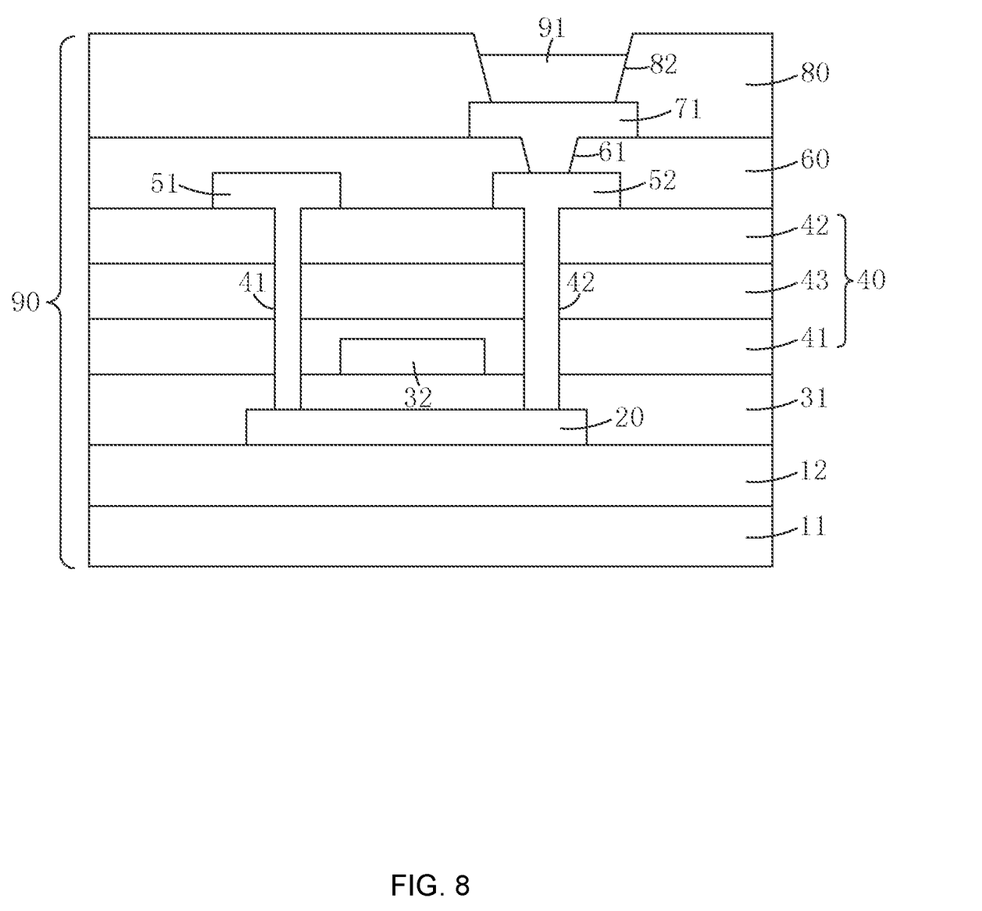
FIG. 8 is a schematic view illustrating step S30 of the manufacturing method of the OLED substrate and the OLED substrate in accordance with one embodiment of the present disclosure.

In step S30, as shown in FIG. 8, forming a pixel definition layer 80 on the anode 71 and the flat layer 60, forming a second through hole 82, corresponding to a top of the anode 71, on the pixel definition layer 80, and forming an OLED light-emitting layer 91 on the anode 71 within the second through hole 82 to obtain the OLED substrate 90.

In one example, the pixel definition layer 80 and the flat layer 60 are made of organic photoresist material, such as polyimide.

In one example, the OLED light-emitting layer 91 is manufactured by an evaporation process.

As such, the manufacturing method of the OLED substrate adopting the TFT substrate manufactured of the present disclosure may have a better production yield and quality.

Referring to FIG. 8, the present disclosure relates to the OLED substrate 90, including: the TFT substrate 10 as showing FIG. 5, the flat layer 60 configured on the source 51, the drain 52, and the interlayer dielectric layer 40 of the TFT substrate 10, the anode 71 and the pixel definition layer 80 configured on the flat layer 60, and the OLED light-emitting layer 91 configured on the anode 71.

The first through hole 61 is configured on the flat layer 60. The first through hole 61 corresponds to the top of the drain 52. The anode 71 contacts with the drain 52 via the first through hole 61.

The second through hole 82 is configured on the pixel definition layer 80. The second through hole 82 corresponds to the top of the anode 71. The OLED light-emitting layer 91 is arranged within the second through hole 82.

Specifically, the anode 71 may include the silver thin film and at least one ITO thin film configured on the two ends of the silver thin film.

In one example, the pixel definition layer 80 and the flat layer 60 are made of organic photoresist material, such as polyimide.

As such, the OLED substrate adopting the manufactured of the OLED substrate of the present disclosure may have a better production yield and quality.

In view of the above, the present disclosure relates to the TFT substrate, the manufacturing method thereof, and the OLED substrate. The interlayer dielectric layer manufactured by the manufacturing method of the present disclosure may be configured in the structure of two silicon oxide layers sandwiching one silicon nitride layer. As such, the bonding force between the interlayer dielectric layer and the gate, and the bonding force between the interlayer dielectric layer, and the source and the drain may be improved. The source and the drain may be prevented from falling off from the interlayer dielectric layer during the annealing process. Production yield of the TFT substrate may be improved. As such, the TFT substrate manufactured by the manufacturing method of the present disclosure may have a better production yield and quality, and the OLED substrate manufactured by the manufacturing method of the present disclosure may also have a better production yield and quality.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A manufacturing method of a thin film transistor (TFT) substrate, comprising:
   step S1, providing a base substrate, depositing a buffer layer on the base substrate, and forming an active layer on the buffer layer;
   depositing a gate insulation layer on the active layer and the buffer layer, and forming a gate on the gate insulation layer;
   step S2, depositing an interlayer dielectric layer on the gate and the gate insulation layer, wherein the interlayer dielectric layer comprises a first silicon oxide layer, a first silicon nitride layer, and a second silicon oxide layer stacked on the gate and the gate insulation layer in sequence from bottom to up, wherein the gate is in direct contact with the first silicon oxide layer;
   step S3, conducting a patterned process on the interlayer dielectric layer and the gate insulation layer, and forming a source-contacting hole and a drain-contacting hole in the interlayer dielectric layer and the gate insulation layer, wherein the source-contacting hole and the drain-contacting hole respectively correspond to two ends of the active layer;
   forming a source and a drain on the interlayer dielectric layer to obtain a TFT substrate such that the source and the drain are in direct contact with the second silicon oxide layer, wherein the source and the drain contact with the two ends of the active layer respectively via the source-contacting hole and the drain-contacting hole;
   wherein each of the source and the drain comprises a source-drain metal layer that comprises an aluminum thin film and at least one titanium thin film configured on two ends of the aluminum thin film, the at least one titanium thin film being in contact with the second silicon oxide layer.

2. The manufacturing method of the TFT substrate according to claim 1, wherein the step S2 further comprises:
   conducting a rapid annealing process on the interlayer dielectric layer.

3. The manufacturing method of the TFT substrate according to claim 2, wherein an annealing temperature of the rapid annealing process is in a range from 480 degrees to 510 degrees, and a heat-preservation time period is in a range from 10 minutes to 20 minutes.

4. The manufacturing method of the TFT substrate according to claim 1, wherein the first silicon oxide layer, the first silicon nitride layer, and the second silicon oxide layer are formed by a chemical vapor deposition (CVD) process.

5. The manufacturing method of the TFT substrate according to claim 1, wherein the step S3 further comprises:
   conducting an annealing process on the source and the drain.

* * * * *

UNITED STATES PATENT AND TRADEMARK OFFICE
CERTIFICATE OF CORRECTION

PATENT NO. : 10,879,328 B2
APPLICATION NO. : 16/556141
DATED : December 29, 2020
INVENTOR(S) : Lei Yu and Songshan Li It is certified that error appears in the above-identified patent and that said Letters Patent is hereby corrected as shown below:

On the Title Page

Item (73), should read:
Assignee: WUHAN CHINA STAR OPTOELECTRONICS SEMICONDUCTOR DISPLAY TECHNOLOGY CO., LTD. (Hubei, CN)

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*